(12) United States Patent
Kondo

(10) Patent No.: US 10,889,103 B2
(45) Date of Patent: Jan. 12, 2021

(54) SCREEN PRINTER AND SCREEN PRINTING METHOD

(71) Applicant: FUJI CORPORATION, Chiryu (JP)

(72) Inventor: Takeshi Kondo, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 222 days.

(21) Appl. No.: 16/085,751

(22) PCT Filed: Mar. 24, 2016

(86) PCT No.: PCT/JP2016/059349
§ 371 (c)(1),
(2) Date: Sep. 17, 2018

(87) PCT Pub. No.: WO2017/163360
PCT Pub. Date: Sep. 28, 2017

(65) Prior Publication Data
US 2019/0091989 A1 Mar. 28, 2019

(51) Int. Cl.
*B41F 15/18* (2006.01)
*B41F 15/44* (2006.01)
(Continued)

(52) U.S. Cl.
CPC .......... *B41F 15/44* (2013.01); *B41F 15/0881* (2013.01); *B41F 15/26* (2013.01);
(Continued)

(58) Field of Classification Search
CPC .......... B41F 15/16; B41F 15/18; B41F 15/20; B41F 15/26; B41F 15/36; B41F 15/44;
(Continued)

(56) References Cited

U.S. PATENT DOCUMENTS

| 6,129,014 A * | 10/2000 | Tani ........................ B41F 15/16 |
| | | 101/126 |
| 2012/0090483 A1* | 4/2012 | Willshere ............. H05K 3/1216 |
| | | 101/123 |
| 2014/0307236 A1 | 10/2014 | Kobayashi et al. |

FOREIGN PATENT DOCUMENTS

| JP | 5-92544 A | 4/1993 |
| JP | 2010-82919 A | 4/2010 |

(Continued)

OTHER PUBLICATIONS

International Search Report dated Jun. 14, 2016 in PCT/JP2016/059349 filed on Mar. 24, 2016.

*Primary Examiner* — Leslie J Evanisko

(74) *Attorney, Agent, or Firm* — Oblon, McClelland, Maier & Neustadt, L.L.P.

(57) ABSTRACT

Screen printer 10 is for screen printing solder paste 13 loaded on an upper surface of stencil 12 onto board S using one of first and second squeegees 71 and 72. Screen printer 10 is provided with a stencil frame holding rail that holds stencil frame 12*a* of stencil 12, pair of board holding members 36 and 38 that hold board S, raising and lowering table 16 that raises and lowers board holding members 36 and 38, and pair of stencil supporting members 50 and 52 that support stencil 12 from below at a portion outside a printing region of stencil 12 used for screen printing. Stencil supporting members 50 and 52 are provided independently from raising and lowering table 16. Therefore, the load applied to raising and lowering table 16 is reduced. Also, there is increased design freedom with respect to members and the like loaded on raising and lowering table 16.

8 Claims, 9 Drawing Sheets

(51) Int. Cl.
  *B41F 15/36* (2006.01)
  *B41F 15/08* (2006.01)
  *B41F 33/00* (2006.01)
  *B41F 35/00* (2006.01)
  *B41F 15/26* (2006.01)
  B41F 15/42 (2006.01)
  B41F 15/46 (2006.01)
  H05K 3/34 (2006.01)

(52) U.S. Cl.
  CPC .......... *B41F 15/36* (2013.01); *B41F 33/0081* (2013.01); *B41F 35/005* (2013.01); *B41F 15/423* (2013.01); *B41F 15/46* (2013.01); *B41P 2215/112* (2013.01); *B41P 2215/114* (2013.01); *B41P 2235/242* (2013.01); *B41P 2235/244* (2013.01); *B41P 2235/27* (2013.01); *H05K 3/3485* (2020.08)

(58) Field of Classification Search
  CPC ... H05K 3/1216; H05K 3/1225; H05K 3/1233
  USPC ....................................................... 101/126
  See application file for complete search history.

(56) References Cited

FOREIGN PATENT DOCUMENTS

| | | |
|---|---|---|
| JP | 2011-189673 A | 9/2011 |
| JP | 2012-245765 A | 12/2012 |
| JP | 2013-103417 A | 5/2013 |
| JP | 2013-116584 A | 6/2013 |

* cited by examiner

SCREEN PRINTER AND SCREEN PRINTING METHOD

TECHNICAL FIELD

The present application relates to a screen printer and a screen printing method.

BACKGROUND ART

Conventionally, there are known screen printers that screen print onto a board using a squeegee to print a viscous fluid loaded on the top surface of a stencil. For example, with the screen printer disclosed in patent literature 1, loaded on a table of a first raising and lowering device are a pair of board holding members, a second raising and lowering device that raises and lowers the board holding members, and a pair of stencil supporting members provided at each side. The pair of board holding members hold the board by sandwiching the front and rear side surfaces of the rectangular board. The pair of board holding members holding the board are raised to a printing position at which the board contacts the lower surface of the stencil and lowered from the printing position by the first and second raising and lowering devices. The pair of stencil supporting members are raised and lowered together with the pair of board holding members by the first raising and lowering device and support the lower surface of the stencil at both sides of the pair of board holding members holding the board during screen printing. Here, the support surface of the pair of stencil supporting members is positioned to be on the same plane as the upper surface of the board. A similar type of screen printer is disclosed in patent literature 2.

CITATION LIST

Patent Literature

Patent literature 1: JP-A-2013-116584
Patent literature 2: JP-A-2013-103417

BRIEF SUMMARY

Technical Problem

However, with such a screen printer, because a pair of stencil supporting members are loaded on a table of a first raising and lowering device, the load on the first raising and lowering device is large and it is difficult to load other members or devices on the table of the first raising and lowering device, resulting in a problem of lower design freedom.

The present disclosure solves the above problems and an object thereof is to reduce the load on a board supporting member raising and lowering device while improving the design freedom with regard to loading members or devices on the raising and lowering device.

Solution to Problem

A screen printer of the present disclosure is for screen printing a viscous fluid loaded on an upper surface of a stencil using a squeegee, the screen printer including:
a stencil edge section holding member configured to hold an edge section of the stencil;
a board holding member configured to hold a board;
a board holding member raising and lowering device configured to raise and lower the board holding member to and from a printing position set at a specified height for screen printing and a lower position that is lower than the printing position; and
a stencil supporting member provided independently from the board holding raising and lowering device and configured to support from below a portion of the stencil outside a printing region of the stencil that is used when performing screen printing, the edge section of the stencil being held by the stencil edge section holding member.

With this screen printer, the stencil supporting member is provided independently from the board holding member raising and lowering device. That is, the stencil supporting member is provided at a position not affected by the raising and lowering of the board holding member by the board holding member raising and lowering device. Therefore, the load applied to the board holding member raising and lowering device is reduced. Also, there is increased design freedom with respect to members and devices loaded on the board holding member raising and lowering device.

The screen printer of present disclosure may further include
a squeegee raising and lowering device configured to raise and lower the squeegee to and from a contact position at which the squeegee contacts the upper surface of the stencil of which the edge section is held by the stencil edge holding member and a separation position that is higher than the contact position, and
a control device configured to control the board holding member raising and lowering device and the squeegee raising and lowering device such that the squeegee arrives at the contact position before the board holding member holding the board is raised to the printing position in a screen printing preparation phase.

With this screen printer, a portion outside of a printing region of the stencil is supported by a stencil supporting member. Therefore, even if the squeegee reaches the contact position before the board holding member holding the board has been raised to the printing position, the printing pressure of the squeegee can be adjusted without the printing region being warped down by the squeegee. As a result, because it is possible to perform squeegee printing preparation regardless of the state of the board holding member raising and lowering device, the cycle time is reduced and productivity is improved.

With this screen printer, it is desirable for the contact position to be set directly on the supporting surface of the stencil supporting member. This reliably prevents the printing region being warped down by the squeegee.

The screen printer of the present disclosure may further include
an imaging device provided to move below the stencil in a direction parallel to the stencil and configured to image a stencil reference section and a board reference section used for alignment provided respectively on the printing region of the stencil and the board, and
a control means configured to control the board holding member raising and lowering device and the imaging device such that the imaging device images the stencil reference section and the board reference section in the screen printing preparation phase after making the gap between the lower surface of the stencil and the board held by the board holding member such that the imaging device can pass through the gap.

With this screen printer, a portion outside of a printing region of the stencil is supported by a stencil supporting member. Therefore, there is virtually no deviation between the position of a stencil reference section when imaged by the imaging device and the position of the stencil reference section when performing screen printing. As a result, the accuracy when performing alignment of the stencil and the board using the stencil reference section and the board reference section is improved.

The screen printer of the present disclosure may further include
a negative pressure device configured to supply negative pressure to a negative pressure suction surface that supports a lower surface of the stencil among the stencil supporting member,
a stencil supporting member moving device configured to move the stencil supporting member in a direction parallel to the stencil, and
a control device configured to control the negative pressure supply device and the stencil supporting member moving device such that, when the board holding member holding the board is at a cleaning position that is lower than the printing position, the stencil supporting member is moved in the direction parallel to the stencil while negative pressure is supplied to the negative pressure suction surface such that the lower surface of the stencil is sucked to the negative pressure suction surface.

With this screen printer, a stencil supporting member provided with a negative pressure suction surface is used to support and hold the stencil by suction and to clean the stencil. Therefore, compared to a case in which a stencil supporting member and a cleaning device are provided separately, the size of the screen printer can be reduced.

With the screen printer, the stencil supporting member may be provided as a pair to sandwich the printing region, and the stencil supporting member moving device may move at least one of the pair of the stencil supporting members in the direction parallel to the stencil. Accordingly, it is possible to change the gap between the pair of stencil supporting members in accordance with the size of the printing region, and the drive source for changing the gap between the pair of stencil supporting members and the drive source for cleaning the stencil can be shared.

A screen printing method of the present disclosure is for screen printing a viscous fluid loaded on an upper surface of a stencil using a squeegee, the screen printing method including:
(a) a step of holding the board using a board holding member;
(b) a step of raising the board holding member using a board holding member raising and lowering device to a printing position set at a specified height for screen printing, and during a screen printing preparation phase that is before the step (b), causing the squeegee to reach a contact position contacting the stencil when a portion of the stencil outside of a printing region of the stencil that is used for screen printing is supported from below by a stencil supporting member provided separately to the board holding member raising and lowering device.

With this screen printing method, during the screen printing preparation phase, even if the squeegee reaches the contact position before the board holding member holding the board has been raised to the printing position, because the portion of the stencil outside of the printing region of the stencil is supported by the stencil supporting member, the printing pressure of the squeegee can be adjusted without the printing region being warped down by the squeegee. As a result, because it is possible to perform squeegee printing preparation regardless of the state of the board holding member raising and lowering device, the cycle time is reduced and productivity is improved.

Another screen printing method of the present disclosure is for screen printing a viscous fluid loaded on an upper surface of a stencil using a squeegee, the screen printing method including:
(a) a step of holding the board using a board holding member;
(b) a step of raising the board holding member using a board holding member raising and lowering device to a printing position set at a specified height for screen printing, and during a screen printing preparation phase that is after the step (a) and before the step (b), when a portion of the stencil outside of the printing region of the stencil that is used when performing screen printing is supported from below by the stencil supporting member provided separately to the board holding member raising and lowering device, using an imaging device to image a stencil reference section and a board reference section used for alignment provided respectively on the printing region of the stencil and the board after making the gap between a lower surface of the stencil and the board held by the board holding member such that the imaging device can pass through the gap.

With this screen printing method, during the screen printing preparation phase, when the stencil reference section and the board reference section provided respectively on the printing region and the board are imaged by the imaging device, a portion of the stencil outside of the printing region of the stencil is supported by the stencil supporting member. Therefore, there is virtually no deviation between the position of a stencil reference section when imaged by the imaging device and the position of the stencil reference section when performing screen printing. As a result, the accuracy when performing alignment of the stencil and the board using the stencil reference section and the board reference section is improved.

Another screen printing method of the present disclosure is for screen printing a viscous fluid loaded on an upper surface of a stencil using a squeegee, the screen printing method including:
(a) a step of holding the board using a board holding member;
(b) a step of performing screen printing in a state with a portion of the stencil outside of a printing region of the stencil that is used when performing screen printing being supported from below the stencil using a negative pressure suction surface of a stencil supporting member that is provided separately to the board holding member raising and lowering device and the board holding member raised to a printing position set at a specified height for screen printing using the board holding member raising and lowering device; and
(c) a step of performing cleaning by moving the stencil holding member in a direction parallel to the stencil after the board holding member has been raised to a cleaning position that is lower than the printing position and while supplying negative pressure to the negative pressure suction surface such that the lower surface of the stencil is sucked to the negative pressure suction surface.

With this screen printing method, a stencil supporting member provided with a negative pressure suction surface is used to support and hold the stencil by suction and to clean the stencil. Therefore, compared to a case in which a stencil supporting member and a cleaning device are provided separately, the size of the screen printer can be reduced.

DESCRIPTION OF EMBODIMENTS

Figure 1:
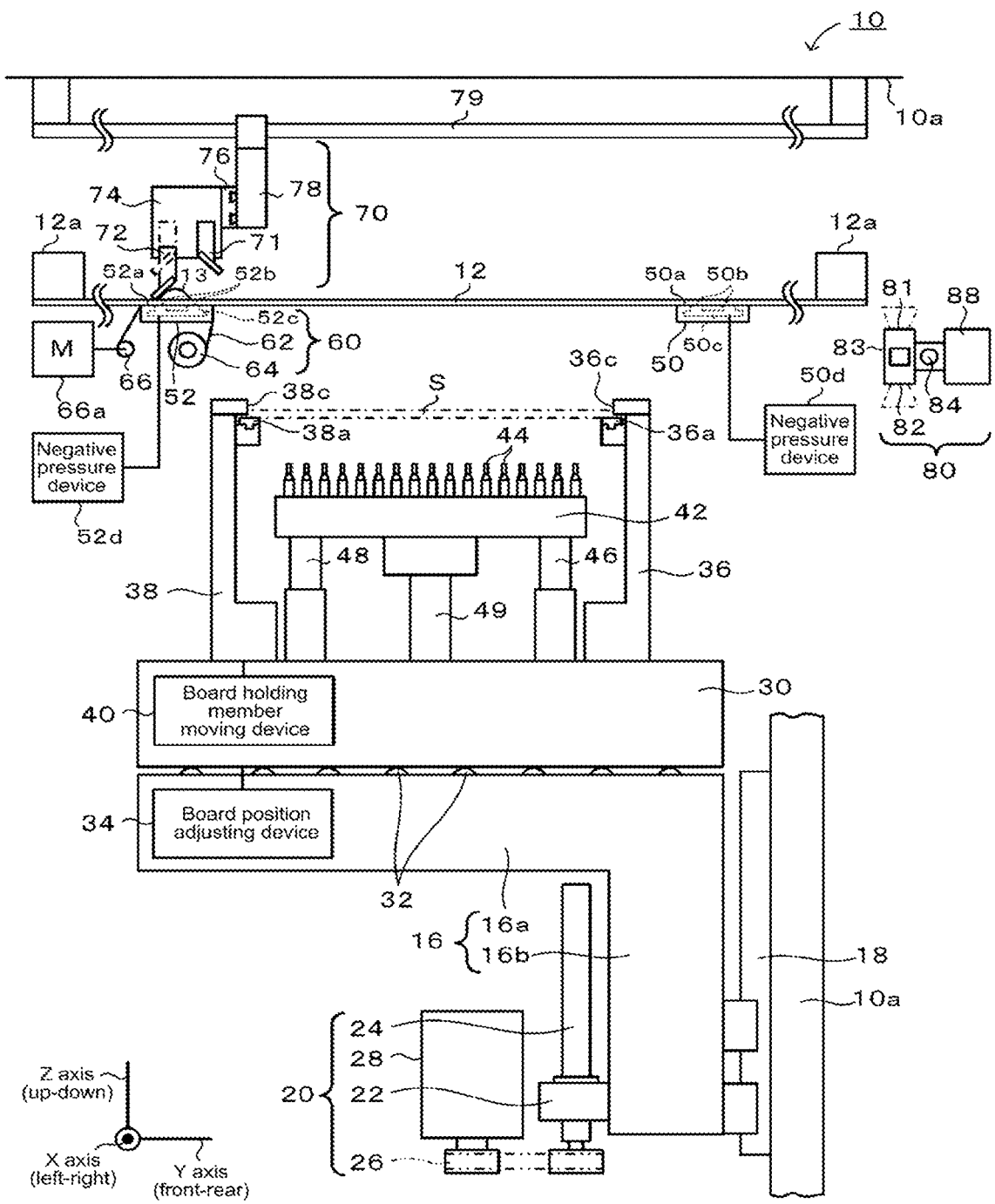
FIG. 1 is a schematic view of screen printer 10.
Figure 2:
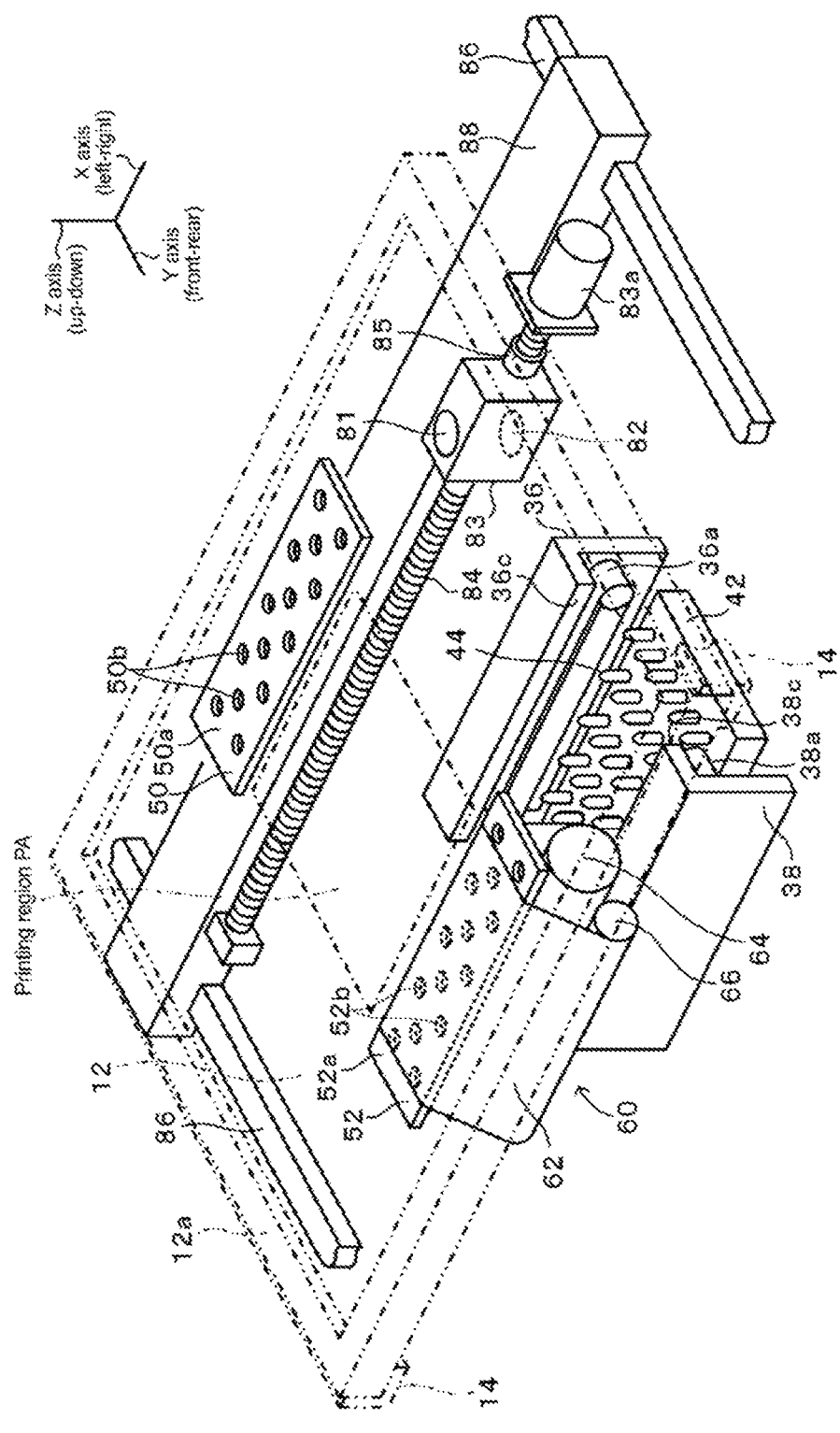
FIG. 2 is a perspective view of a portion of screen printer 10.
Figure 3:
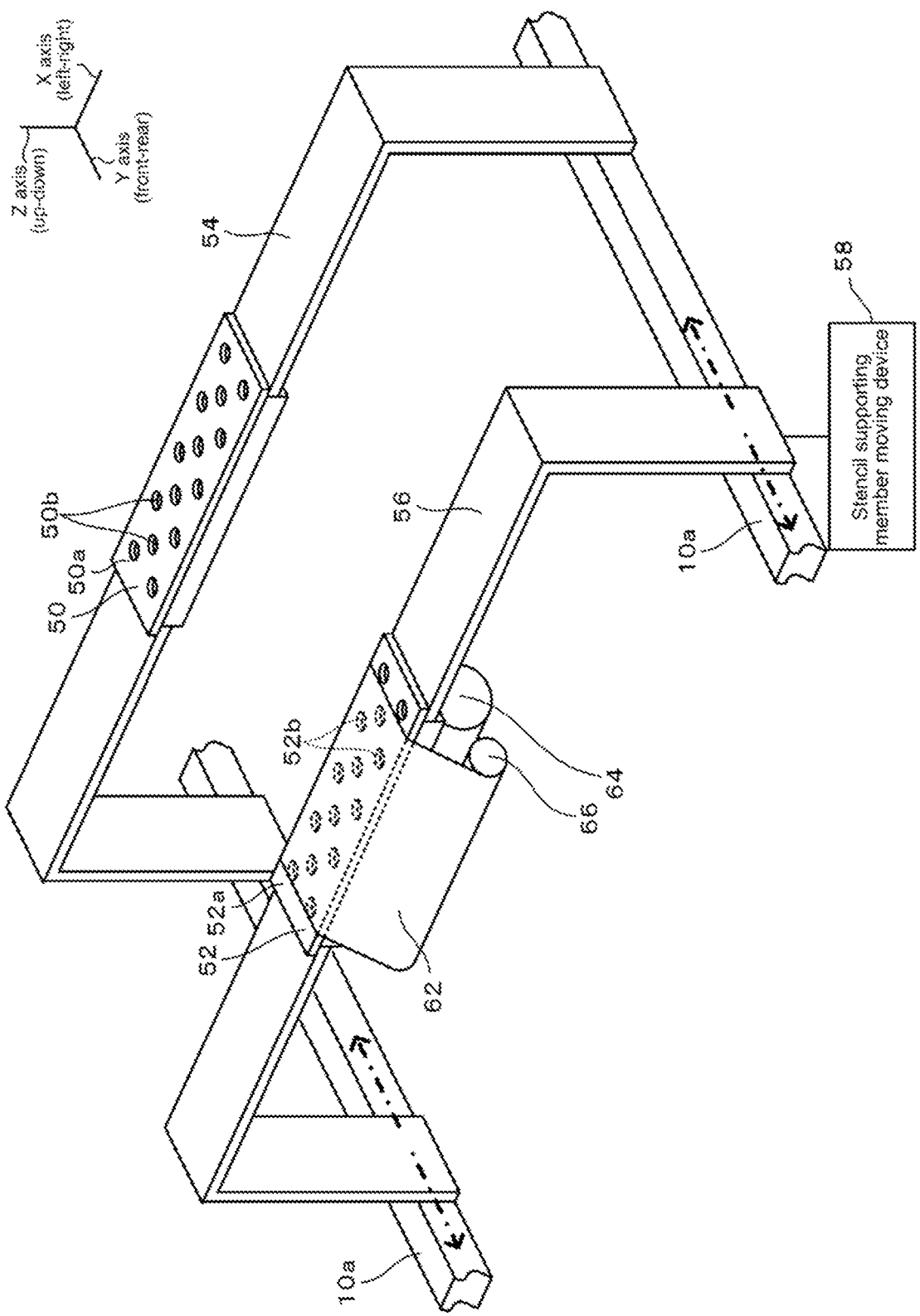
FIG. 3 is a perspective view of pair of stencil supporting members 50 and 40
Figure 4:
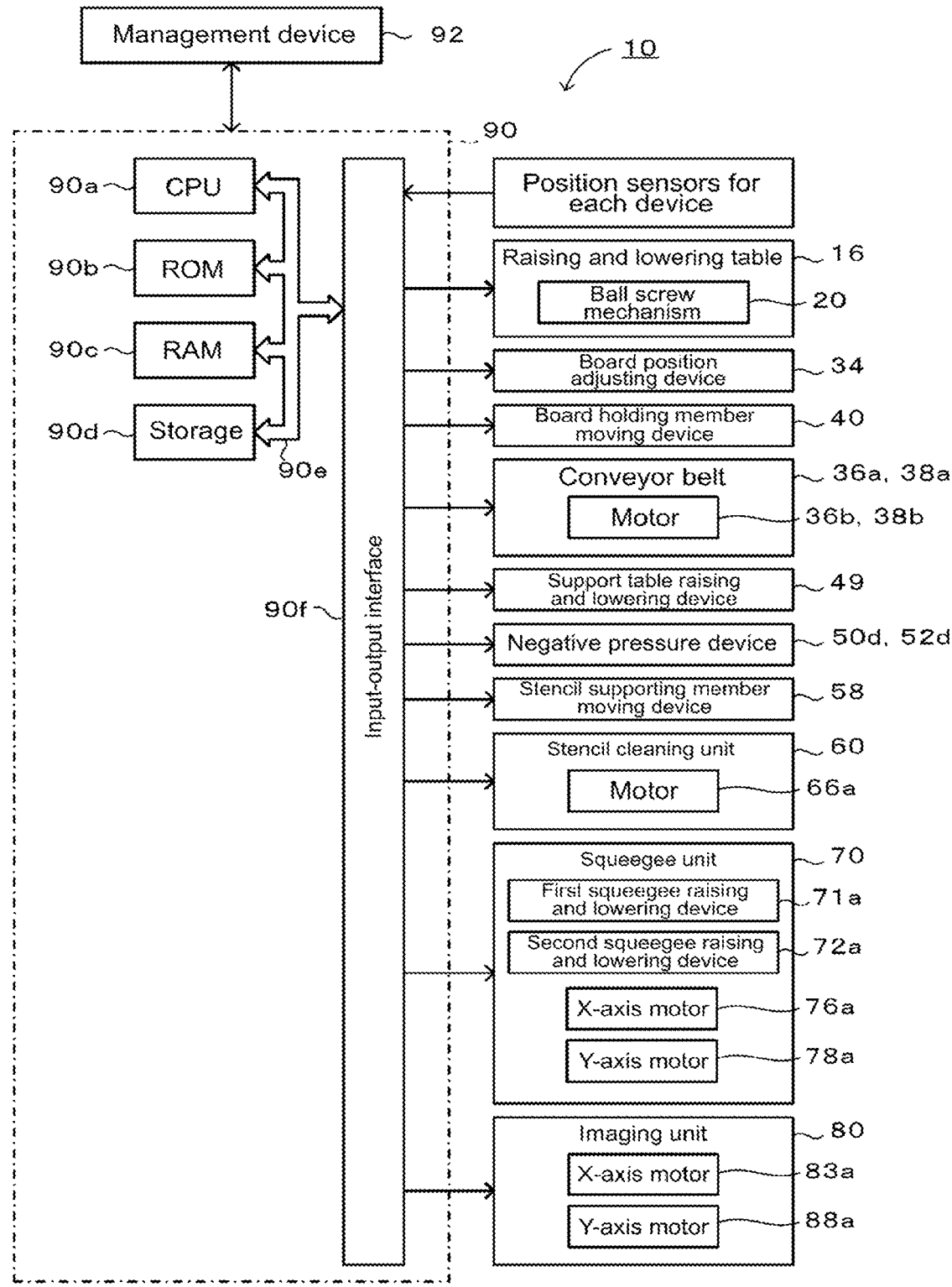
FIG. 4 is a block diagram showing electrical connections of screen printer 10.

A suitable embodiment of the present disclosure is described below with reference to the figures. FIG. 1 is a schematic view of screen printer 10 of an embodiment; FIG. 2 is a perspective view of a portion of screen printer 10; FIG. 3 is a perspective view of pair of stencil supporting members 50 and 52; FIG. 4 is a block diagram showing electrical connections of screen printer 10. Note that, in the present embodiment, as shown in FIGS. 1 to 3, the left-right direction of screen printer 10 is the X axis, the front-rear direction is the Y axis, and the up-down direction is the Z axis.

As shown in FIG. 1, screen printer 10 is for screen printing solder paste (viscous fluid) 13 loaded on an upper surface of stencil 12 onto board S using one of first and second squeegees 71 and 72.

Screen printer 10 is provided with stencil frame holding rails 14 (refer to FIG. 2), raising and lowering table 16, moving table 30, pair of board holding members 36 and 38, support table 42, pair of stencil supporting members 50 and 52, squeegee unit 70, and imaging unit 80.

As shown in FIG. 2, stencil frame holding rails 14 are rails with an L-shaped cross section that hold stencil frame 12a attached to an edge section of stencil 12, which is a thin metal screen that is substantially a quadrangle. Stencil frame holding rails 14 extend along the Y axis and are provided as a pair spaced apart in the X-axis direction along the left and right sides of screen printer 10. Stencil 12 is held on stencil frame holding rails 14 to be horizontal. When stencil 12 is exchanged, an operator grips stencil frame 12a of the currently held stencil 12 and removes it by pulling forward, then inserts stencil frame 12a of a different stencil 12 onto the pair of stencil frame holding rails 14.

Raising and lowering table 16 is provided with horizontal table platform 16a and leg section 16b extending vertically downwards from table platform 16a. Leg section 16b is slidably attached to guide rail 18, which extends in the Z-axis direction and is attached to machine frame 10a of screen printer 10. Raising and lowering table 16 is raised and lowered by ball screw mechanism 20. Ball screw mechanism 20 is provided with nut 22 attached to leg section 16b, ball screw 24 engaged with nut 22, and motor 28 that transmits driving power to ball screw 24 via belt 26. Thus, raising and lowering table 16 is raised and lowered along guide rail 18 when motor 28 of ball screw mechanism 20 is rotated.

Moving platform 30 is supported on an upper surface of table platform 16a of raising and lowering table 16 via multiple steel balls 32. Thus, moving table 30 is able to smoothly move on the upper surface of table platform 16a in the XY directions and rotate around the Z axis. The position of moving platform 30 is adjusted in the X-axis direction, Y-axis direction, and rotation direction by board position adjusting device 34 provided on raising and lowering table 16. For board position adjusting device 34, as an X-axis position adjusting device that adjusts the position in the X-axis direction, for example, a rod-shaped protrusion may be provided at the side surface of a front end or rear end of moving table 30, and the rod-shaped protrusion may be moved in the X-axis direction by a ball screw mechanism provided on raising and lowering table 16. The ball screw mechanism may be configured from a ball screw extending in the X-axis direction, a nut engaged with the ball screw, and a slider integrated with the nut, with the rod-shaped protrusion being sandwiched by a side surface of a cylindrical roller and a curved surface of a ball provided on the slider. In this case, a spring is attached to the ball, and due to the biasing of the spring, the curved surface of the ball presses the rod-shaped protrusion against the cylindrical roller. Accordingly, when the ball screw is rotated, the slider integrated with the nut moves in the X-axis direction such that moving table 30 moves in the X-axis direction. A Y-axis direction position adjusting device that adjusts the position in the Y-axis direction may be configured in a similar manner. Also, adjustment of the position in the rotational direction (rotation position around the Z-axis) may be performed by simultaneously operating the above X-axis direction position adjusting device and Y-axis direction position adjusting device. Details of such a board position adjusting device 34 are disclosed in JP-A-2007-38456. Note that, board position adjusting device 34 is not limited to the above configuration and may be configured from, for example, a slider that can slide in the X-axis direction, a slider that slide in the Y-axis direction, and a slider that can rotate around the Z-axis.

Pair of board holding members 36 and 38 are reverse L-shaped members with an upper section bend inwards, and are provided spaced apart in the Y-axis direction on an upper surface of moving table 30. Of the pair, board holding member 36 is fixed on moving table 30, and the other of the pair, board holding member 38, is attached to moving table 30 to be movable in the Y-axis direction by board holding member moving device 40. Items that may be used as board holding member moving device 40 include, for example, a ball screw mechanism, a linear actuator, an air cylinder or the like. Pair of board holding members 36 and 38 are provided with conveyor belts 36a and 38a, which convey board S in the X-axis direction, on opposite sides facing each other. Conveyor belts 36a and 38a are driven by motors 36b and 38b (refer to FIG. 4) and are used for loading and unloading board S to and from screen printer 10. Pair of board holding members 36 and 38 are able to sandwich side surfaces of board S from the front and rear via inside surfaces 36c and 38c of the widthwise portions of the bent upper section. Note that, because pair of board holding members 36 and 38 are raised and lowered by raising and lowering table 16 via moving table 30, raising and lowering table 16 corresponds to the board holding member raising and lowering device.

Support table 42 is provided with multiple support pins 44 on an upper surface of support table 42. Support pins 44 are pins that support board S, which is on conveyor belts 36a and 38a, from below. Support table 42 is movable along guide rods 46 and 48 that are established on an upper surface of moving table 30 extending in the Z-axis direction. Support table 42 is raised and lowered by support table raising and lowering device 49 provided on an upper surface of moving table 30. Items that may be used as support table raising and lowering device 49 include, for example, a ball screw mechanism, a linear actuator, an air cylinder or the like.

As shown in FIG. 2, pair of stencil supporting members 50 and 52 are for supporting from below stencil 12 for which stencil frame 12a is supported by stencil frame holding rails 14, and supporting members 50 and 52 are provided spaced apart in the Y-axis direction. Stencil supporting members 50 and 52 are attached directly to a portion of machine frame 10a of screen printer 10 via bridge members 54 and 56, as shown in FIG. 3, not to an upper surface of moving table 30. Bridge members 54 and 56 are provided straddling raising and lowering table 16 and moving table 30, support table 42, and pair of board holding members 36 and 38. Therefore, pair of stencil supporting members 50 and 52 are not affected by operation of raising and lowering table 16, moving table 30, or support table 42. Out of stencil supporting members 50 and 52, stencil supporting member 50 is fixed to a portion of machine frame 10a so as not to be movable, while stencil supporting member 52 is provided independently to raising and lowering table 16, moving table 30, and support table 42 and is attached to be movable in the Y-axis direction by stencil supporting member moving device 58. Items that may be used as stencil supporting member moving device 58 include, for example, a ball screw mechanism, a linear actuator, an air cylinder or the like. As shown in FIG. 1, stencil supporting members 50 and 52 are provided with stencil supporting surfaces 50a and 52a, holes 50b and 52b provided on stencil supporting surfaces 50a and 52a, and hollow sections 50c and 52c connected to holes 50b and 52b. Stencil supporting surfaces 50a and 52a are both contacting the surface of stencil 12. However, stencil supporting surface 52a is contacting stencil 12 via cleaning sheet 62, which is described later. It is possible to supply negative pressure to the multiple holes 50b and 52b from negative pressure devices 50d and 52d via hollow sections 50c and 52c. Thus, stencil supporting surfaces 50a and 52a correspond to the negative pressure suction surface.

Stencil supporting member 52 that can move horizontally is provided with stencil cleaning unit 60. Stencil cleaning unit 60 is provided with supply roller 64 that supplies unused cleaning sheet 62, and collection roller 66 that winds up used cleaning sheet 62. Rollers 64 and 66 are arranged below stencil supporting surface 52a at positions not to interfere with board holding member 38 or the like. Cleaning sheet 62 is, for example, breathable paper or cloth, and is stretched from supply roller 64 to collection roller 66 via the upper surface of stencil supporting surface 52a. Collection roller 66 is able to wind up cleaning sheet 62 by being rotated by motor 66a.

Squeegee unit 70 is provided with first and second squeegees 71 and 72 that slope in opposite directions, squeegee head 74 to which first and second squeegees 71 and 72 are attached to be raisable and lowerable by first and second squeegee raising and lowering devices 71a and 72a (refer to FIG. 4), X-axis slider 76 that holds squeegee head 74, and Y-axis slider 78 that supports X-axis slider 76 to be slidable in the X-axis direction. Y-axis slider 78 is slidably attached to guide rail 79, which extends in the Y-axis direction and is attached to machine frame 10a of an upper section of screen printer 10. X-axis slider 76 and Y-axis slider 78 are respectively moved in the X-axis direction and the Y-axis direction by X-axis motor 76a and Y-axis motor 78a (refer to FIG. 4).

As shown in FIG. 2, imaging unit 80 is provided with upper and lower cameras 81 and 82 that respectively image an upper region and a lower region, X-axis slider 83 that holds upper and lower cameras 81 and 82, and Y-axis slider 88 that supports X-axis slider 83 to be slidable in the X-axis direction. X-axis slider 83 is moved in the X-axis direction by being fixed to nut 85 of X-axis direction ball screw 84. Further, both ends of X-axis direction ball screw 84 are attached to Y-axis slider 88 that is slidable along camera Y-axis guide rail 86. Thus, X-axis slider 83 is movable in the Y-axis direction. X-axis direction ball screw 84 and Y-axis slider 88 are respectively driven by X-axis motor 83a and Y-axis motor 88a (refer to FIG. 4).

As shown in FIG. 4, control device 90 is provided with CPU 90a that performs various types of control, ROM 90b on which is stored various types of processing programs and the like, RAM 90c that temporarily stores data, and storage 90d that rewritably stores various types of data, with those items being connected by bus 90e such that data exchange is possible. Detection signals and the like from position sensors of the various devices and so on (raising and lowering table 16, moving table 30, support table 42, board holding member 38, stencil supporting member 52, first and second squeegee 71 and 72, and upper and lower cameras 81 and 82) are entered into control device 90 via input-output interface 90f. Control signals are output from control device 90 via input-output interface 90f to items such as board position adjusting device 34 and ball screw mechanism 20 of raising and lowering table 16, board holding member moving device 40, motors 36b and 38b of conveyor belts 36a and 38a, support table raising and lowering device 49, negative pressure devices 50d and 52d, stencil supporting member moving device 58, motor 66a of stencil cleaning unit 60, first and second squeegee raising and lowering devices 71a and 72a of squeegee unit 70, X-axis motor 76a, Y-axis motor 78a, X-axis motor 83a and Y-axis motor 88a of imaging unit 80, and the like. Further, control device 90 is connected to management device 9 that manages screen printing of board S such that two-way communication is possible.

Next, an example of operation of screen printer 10 is described. Control device 90, first, performs a screen printing preparation processing routine, then performs a screen printing processing routine, and finally performs a screen cleaning processing routine. The programs for these routines are stored on ROM 90b of control device 90. CPU 90a of control device 90 reads the appropriate program from ROM 90b and executes that program. Note that, in an initial state, it is assumed that raising and lowering table 16 and support table 42 are arranged at the lowest position, board holding member 38 is arranged at a position furthest separated from board holding member 36, and stencil supporting member 52 is arranged at a position furthest separated from stencil supporting member 50. Also, it is assumed that imaging unit 80 is arranged at a retract position outside stencil frame 12a, both first and second squeegees 71 and 72 of squeegee unit 70 are arranged at an upper position (a separated position).

It is also assumed that solder paste to be used for screen printing is supplied in advance on stencil 12 directly above one of the pair of stencil supporting members 50 or 52.

Figure 5:
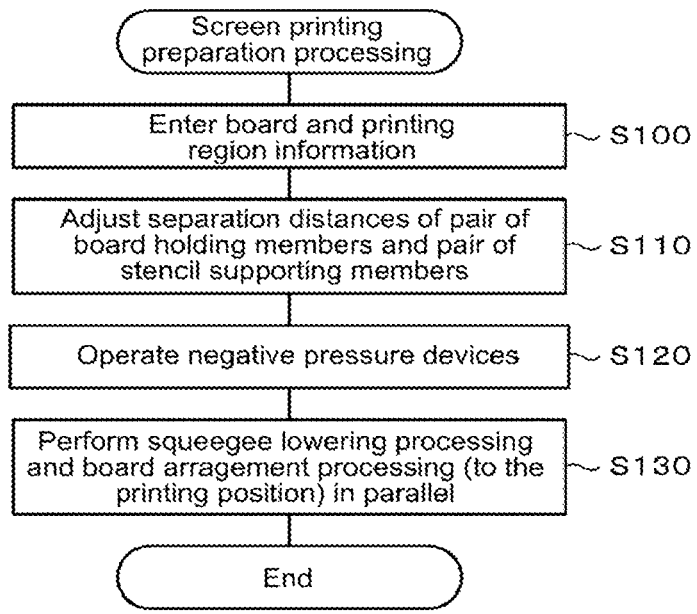
FIG. 5 is a flowchart of a screen printing preparation processing routine.

The screen printing preparation processing routine is described below with reference to the flowchart of FIG. 5. CPU 90a of control device 90, first, receives from management device 92 the size of board S that is the target for the current screen printing, the position of printing region PA to be used during the screen printing, and so on (S100). Note that, the size of printing region PA of stencil 12 is substantially the same size as board S. Continuing, CPU 90a adjusts the separation distance between the pair of board holding members 36 and 38 and the separation distance between the pair of stencil supporting members 50 and 52 (S110). Here, CPU 90a controls board holding member moving device 40 such that the separation distance in the Y-axis direction of inside surfaces 36c and 38c of the pair of board holding members 36 and 38 is slightly larger than the Y-axis direction length of printing region PA. Accordingly, the separation distance between conveyor belts 36a and 38a of the pair of board holding members 36 and 38 is of a size such that board S is supported on the belts. Also, CPU 90a controls stencil supporting member moving device 58 such that the separation distance in the Y-axis direction of the pair of stencil supporting members 50 and 52 is a specified separation distance. Here, the specified separation distance is set to be slightly larger than length L (refer to FIG. 8) from the outer surface of board holding member 36 to the outer surface of board holding member 38 when board S is sandwiched by the pair of board holding members 36 and 38. Accordingly, the portion of stencil 12 outside of printing region PA of stencil 12 of which stencil frame 12a is held by the pair of stencil frame holding rails 14 is supported from below stencil 12 by supporting surfaces 50a and 50b of the pair of stencil supporting members 50 and 52. Continuing, CPU 90a operates negative pressure devices 50d and 52d (S120). Accordingly, negative pressure is supplied to holes 50b and 52b of stencil supporting surfaces 50a and 52a via hollow sections 50c and 52c. Therefore, the lower surface of stencil 12 is held fast by suction to stencil supporting surfaces 50a and 52a. Continuing, CPU 90a performs squeegee lowering processing and arrangement processing of the board to the printing position (board arrangement processing) in parallel (S130) and then ends the routine. This processing is a sub-routine of the screen printing preparation processing routine. Note that, squeegee lowering processing performed in parallel ends before board arrangement processing ends.

Figure 6:
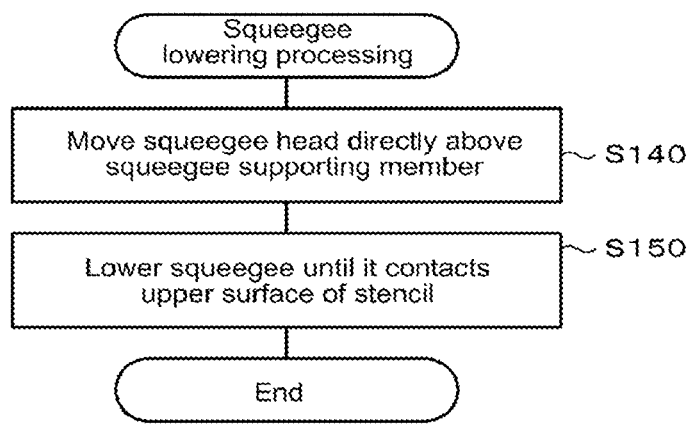
FIG. 6 is a flowchart of squeegee lowering processing (sub-routine).
Figure 7:
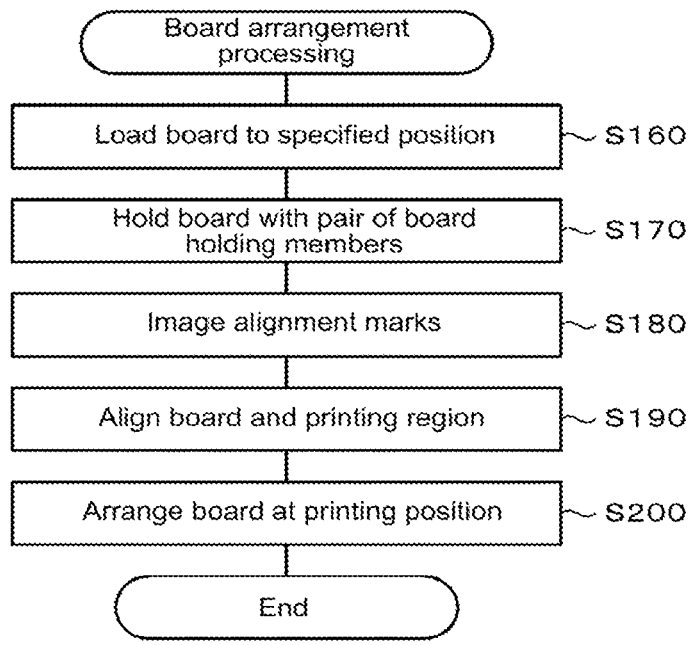
FIG. 7 is a flowchart of board arranging processing (sub-routine).

Squeegee lowering processing and board arrangement processing of S130 are described below. A flowchart for squeegee lowering processing is shown in FIG. 6, and a flowchart for board arrangement processing is shown in FIG. 7. CPU 90a, when starting squeegee lowering processing, first, controls X-axis motor 76a and Y-axis motor 78a of squeegee unit 70 such that squeegee head 74 is positioned directly above the one of the pair of stencil supporting members 50 and 52 at the start position for the current screen printing (in this case, stencil supporting member 50) (S140). Continuing, CPU 90a controls one of first and second squeegee raising and lowering devices 71a and 72a such that the squeegee of the first and second squeegee 71 and 72 positioned above to be used in the current screen printing is lowered to the contact position contacting the upper surface of stencil 12 (S150) and then ends the squeegee lowering processing. Note that, in S150, CPU 90a may adjust the pressure of the squeegee on stencil 12 to a specified pressure.

Figure 8:
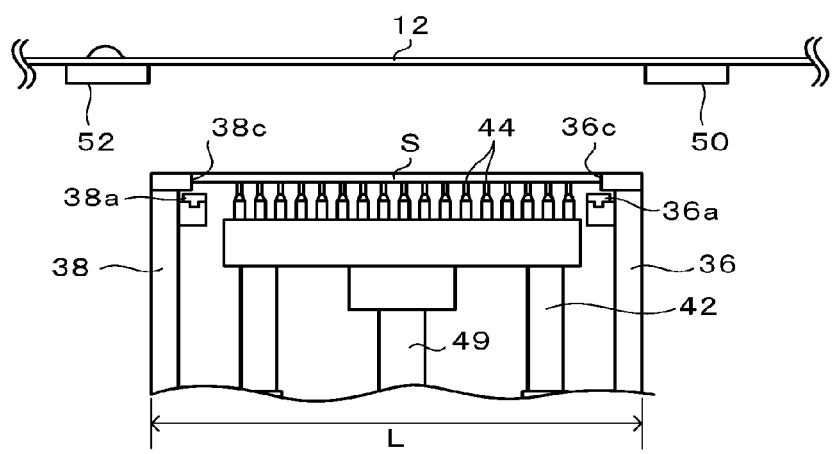
FIG. 8 illustrates a state of holding board S with pair of board holding members 36 and 38.

Further, CPU 90a, when board arrangement processing is started, first, controls motors 36b and 38b of conveyor belts 36a and 38a such that the board S that is the target for the current screen printing is loaded to a specified position (S160). Here, the specified position refers to a position at which board S is between the pair of board holding members 36 and 38. Continuing, CPU 90a causes the pair of board holding members 36 and 38 to hold the board S (S170). Here, CPU 90a controls support table raising and lowering device 49 to raise support table 42 such that support pins 44 contact the lower surface of the board S, and further raises support table 42 such that the upper surface of the board S supported by support pins 44 is at the same horizontal plane as the upper surface of the pair of board holding members 36 and 38. Accordingly, one of the side surfaces of the front or rear of the board S faces inside surface 36c of board holding member 36 and the other of the side surfaces of the front or rear of the board S faces inside surface 38c of board holding member 38. In this state, CPU 90a controls board holding member moving device 40 to move board holding member 38 with respect to board holding member 36 in the Y-axis direction such that the board S is held by the pair of board holding members 36 and 38. Accordingly, inside surfaces 36c and 38c of the pair of board holding members 36 and 38 sandwich the side surfaces of the board S from the front and rear. The state in this case is shown in FIG. 8. Note that, in FIG. 8, squeegee unit 70 is not shown.

Figure 9:
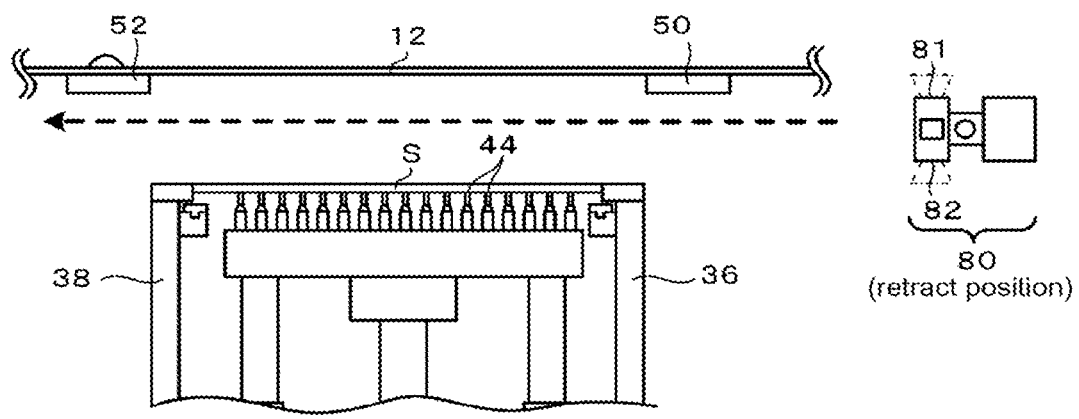
FIG. 9 illustrates a state of imaging marks used for alignment.
Figure 10:
FIG. 10 is a plan view of board S.
Figure 11:
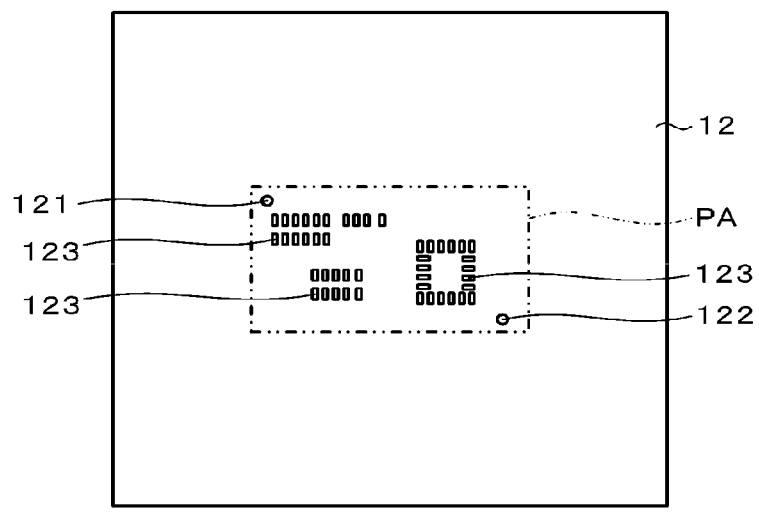
FIG. 11 is a plan view of stencil 12.
Figure 12:
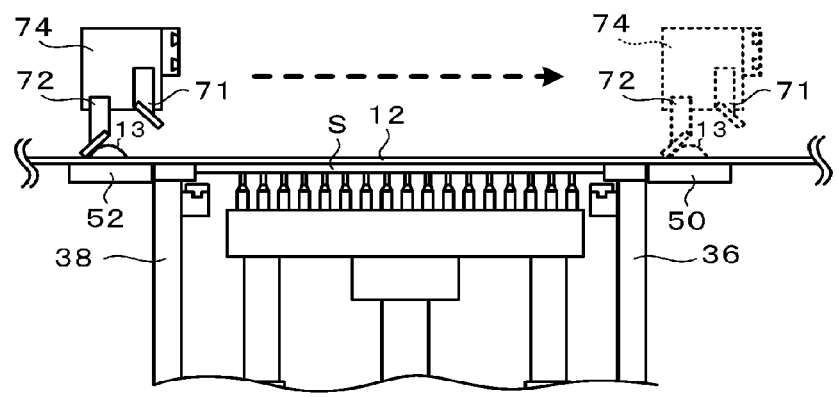
FIG. 12 illustrates a state when board S is positioned at the printing position.

Continuing, CPU 90a controls imaging unit 80 to the image alignment marks (S180). The state in this case is shown in FIG. 9. Note that, in FIG. 9, squeegee unit 70 is not shown. CPU 90a moves upper and lower cameras 81 and 82 in the Y-axis direction from a retract position outside stencil frame 12a to a retract position on the opposite side (the dashed arrow of FIG. 9). During this movement, CPU 90a receives images captured by cameras 81 and 82 when the alignment marks were in the imaging regions (the dot-dash lines of FIG. 9) of the respective cameras 81 and 82. The alignment marks are the first and second board marks M1 and M2 on the upper surface of board S as shown in FIG. 10, and the first and second stencil marks 121 and 122 on the lower surface of printing region PA of stencil 12 as shown in FIG. 11. When the center point of a line joining first stencil mark 121 and second stencil mark 122 is aligned with a center point of a line joining first board mark M1 and second board mark M2, through-holes 123 formed in printing region PA are accurately aligned with the solder printing locations of the board S. Continuing, CPU 90a performs alignment of stencil 12 and board S (S190). Here, based on the captured images, CPU 90a controls board position adjusting device 34 such that the XY coordinates of the center point of the line joining first stencil mark 121 and second stencil mark 122 are aligned with the XY coordinates of the center point of the line joining first board mark M1 and second board mark M2. Continuing, CPU 90a controls ball screw mechanism 20 of raising and lowering table 16 such that the board S held by the pair of board holding members 36 and 38 is positioned at the printing position (S200), then ends the board arrangement processing. The printing position is a height position at which the upper surface of the board S contacts the lower surface of stencil 12. The state in this case is shown in FIG. 12. In FIG. 12, a state is shown in which the above squeegee lowering processing has been completed, that is, a state after which the stencil printing preparation processing routine has ended. Note that, the first and second stencil marks 121 and 122 correspond to the stencil reference section, and the first and second board marks M1 and M2 correspond to the board reference section.

Figure 13:
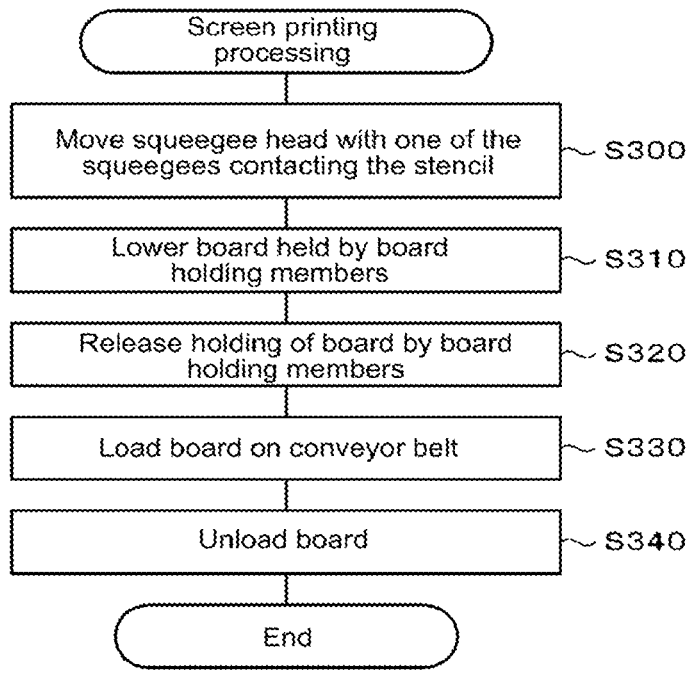
FIG. 13 is a flowchart of a screen printing processing routine.

Next, the screen printing processing routine is described with reference to the flowchart of FIG. 13. CPU 90a of control device 90, first, controls squeegee unit 70 such that, in a state with one of the first and second squeegees 71 and 72 contacting the upper surface of stencil 12, squeegee head 74 moves in the Y-axis direction from one of the pair of stencil supporting members 50 and 52 to the other (S300). Accordingly, solder paste 13 is printed onto the board S through through-holes 123 provided in printing region PA of stencil 12 by the squeegee contacting the upper surface of stencil 12. As a result, solder paste 13 is printed onto the upper surface of the board S in the pattern formed in printing region PA. The dashed lines in FIG. 12 show an example of the state of squeegee unit 70 after screen printing has been completed. Continuing, CPU 90a controls raising and lowering table 16 such that the board S held by the pair of board holding members 36 and 38 is lowered to the position shown in FIG. 8 (S310). Then, CPU 90a controls board holding member moving device 40 to separate board holding member 38 from the board S such that the board S is released (S320). Next, CPU 90a controls support table raising and lowering device 49 to lower support table 42 such that support pins 44 are separated from the lower surface of the board S and the board S is loaded on conveyor belts 36a and 38a (S330). Continuing, CPU 90a controls conveyor belts 36a and 38a to unload the board S (S340), then ends the routine. Note that, in the next screen printing preparation processing, if screen printing is to be performed on the same type of board S, S100 to S120 can be omitted.

Figure 14:
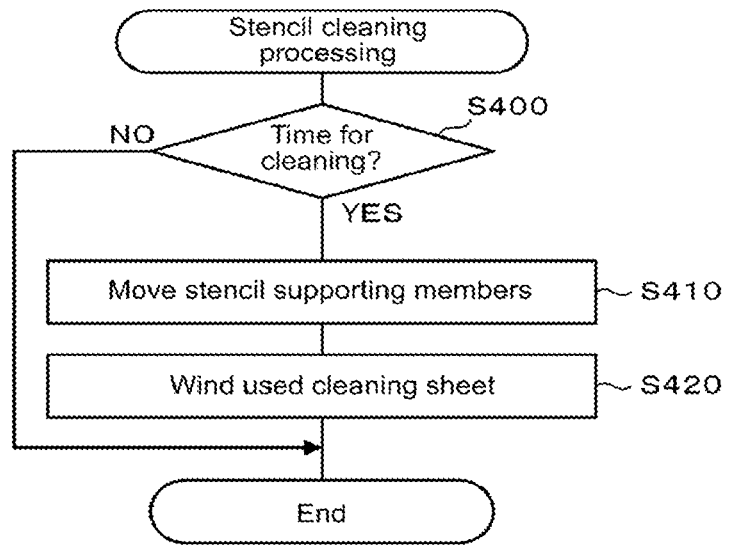
FIG. 14 is a flowchart of a stencil cleaning processing routine.
Figure 15:
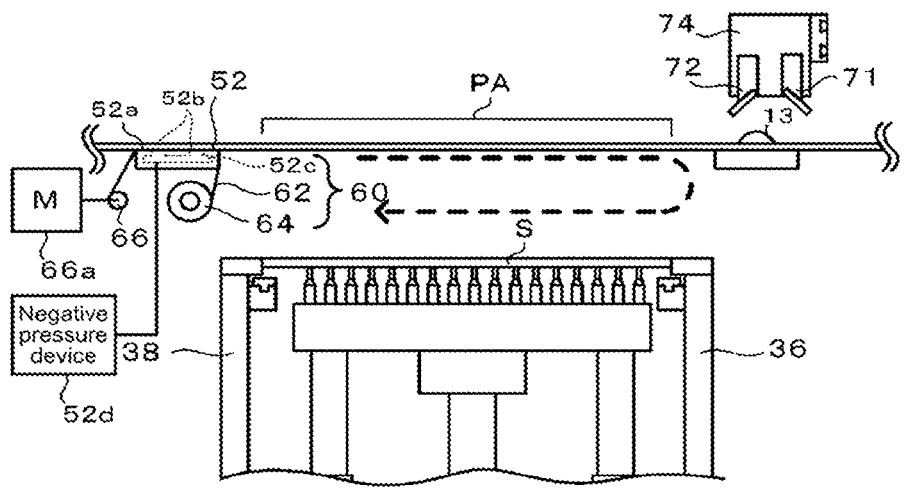
FIG. 15 illustrates a state when cleaning stencil 12.

Next, the stencil cleaning processing routine is described with reference to the flowchart of FIG. 14. CPU 90a of control device 90 starts the stencil cleaning processing routine at the point when S310 of the screen printing processing routine has been performed and the board S held by the board holding members 36 and 38 has been lowered to the position shown in FIG. 8 (cleaning position). The state in this case is shown in FIG. 15. CPU 90a, when processing is started, determines whether it is time to perform cleaning (S400), and ends the routine if it is not time to perform cleaning. On the other hand, if it is time to perform cleaning, CPU 90a controls stencil supporting member moving device 58 such that stencil supporting member 52 goes into and beyond printing region PA of stencil 12 and then returns to its original position (S410, refer to the dashed arrow in FIG. 15). By this, cleaning sheet 62 covering the upper surface of stencil supporting surface 52a wipes off solder paste adhering to the lower surface of printing region PA of stencil 12. At the same time, solder paste in through-holes 123 (refer to FIG. 11) of printing region PA is sucked out by negative pressure supplied to holes 52b of stencil supporting surface 52a from negative pressure device 52d via hollow section 52c. Continuing, CPU 90a controls motor 66a of stencil cleaning unit 60 such that the surface of cleaning sheet 62 that was just used is wound onto collection roller 66 (S420), then ends the routine. By this, stencil supporting surface 52a is covered by a new cleaning sheet 62. Note that, cleaning may be performed after every time screen printing ends, or after screen printing has been performed a set quantity of times. An operator may set the timing for performing cleaning.

According to the above-described screen printer 10, the pair of stencil supporting members 50 and 52 is provided independently from raising and lowering table 16. That is, the pair of stencil supporting members 50 and 52 is provided at a position not affected by the raising and lowering of the pair of board holding members 36 and 38. Therefore, the load applied to raising and lowering table 16 is reduced. Also, there is increased design freedom with respect to members and devices loaded on raising and lowering table 16.

Also, with screen printer 10, a portion of stencil 12 outside of printing region PA of stencil 12 is supported by pair of stencil supporting members 50 and 52. Therefore, even if the first or second squeegee 71 or 72 reaches the contact position before the pair of board holding members 36 and 38 holding the board S has been raised to the printing position, the printing pressure of the squeegee can be adjusted without printing region PA being warped down by the squeegee. As a result, because it is possible to perform squeegee printing preparation regardless of the state of raising and lowering table 16, the cycle time is reduced and productivity is improved. In particular, because the squeegee contact position is directly above stencil supporting surface 52a of stencil supporting member 52, it is possible to reliably prevent printing region PA being warped downwards by the squeegee. Also, because stencil supporting surfaces 50a and 52a hold stencil 12 firmly via negative pressure, it is possible to even more reliably prevent printing region PA being warped downwards by the squeegee.

Further, with screen printer 10, because a portion of stencil 12 outside of printing region PA of stencil 12 is supported by pair of stencil supporting members 50 and 52, there is virtually no deviation between the position of first and second stencil marks 121 and 122 when imaged by upper camera 81 and the position of first and second stencil marks 121 and 122 when performing screen printing. As a result, the accuracy when performing alignment of stencil 12 and board S using first and second stencil marks 121 and 122 and first and second board marks M1 and M2 is improved.

Further, with screen printer 10, stencil supporting member 52 provided with stencil supporting surface 52a supplied with negative pressure is used for cleaning stencil 12 as well as for holding stencil 12 by suction. Therefore, compared to a case in which stencil supporting member 52 and a cleaning device are provided separately, the size of screen printer 10 can be reduced. Also, because cleaning sheet 62 is always in contact with the lower surface of stencil 12, compared to a case in which there is a cleaning unit with a cleaning sheet 62 that has to be made to contact the lower surface of stencil 12 from a position below stencil 12, the cleaning time can be shortened.

Further, with screen printer 10, because one of the pair of stencil supporting members 50 and 52 is movable in a direction parallel to stencil 12, the separation distance between the pair of stencil supporting members 50 and 52 can be changed in accordance with the size of printing region PA, and stencil supporting member moving device 58 can also be used as a drive source when performing cleaning of the stencil.

Meanwhile, it goes without saying that the disclosure is not limited to the above-mentioned embodiment and various embodiments may be applied within the technical scope of the disclosure.

For example, in an embodiment above, out of the pair of stencil supporting members 50 and 52, stencil supporting member 50 is fixed to machine frame 10a so as not to be movable, while stencil supporting member 52 is attached to machine frame 10 a to be movable in a horizontal direction, however, both may be movable in the horizontal direction. In this case, the separation distance between the pair of stencil supporting members 50 and 52 may be adjusted by moving both members. Also, in this case, if a stencil cleaning unit 60 is also attached to stencil supporting member 50, stencil 12 may be cleaned by moving both stencil supporting members 50 and 52.

In an embodiment above, the contact positions at which first and second squeegees 71 and 72 contact the upper surface of stencil 12 are directly above stencil supporting surfaces 50a and 52a, but the contact positions may be anywhere outside printing region PA. For example, the contact positions may be between stencil supporting surface 50a and stencil frame 12a and between stencil supporting surface 52a and stencil frame 12a. In this case, printing region PA of stencil 12 would not be warped even if stencil 12 is pressed by the squeegee. However, it is desirable for the contact positions to be directly above stencil supporting surfaces 50a and 52a as in an embodiment above.

In an embodiment above, the cleaning positions of board holding members 36 and 38 when performing the stencil cleaning processing routine are as shown in FIG. 15, but they are not limited to this, and may be positioned anywhere lower than the printing position (see FIG. 12) such that a space is created to allow stencil cleaning unit 60 to pass between stencil 12 and board holding members 36 and 38.

In an embodiment above, ball screws mechanisms are used to move various members, but the configuration is not limited to this, and air cylinders, linear actuators, or the like may be used.

In an embodiment above, solder paste is given as an example of a viscous fluid, but the viscous fluid is not limited to this and may be adhesive, conductive paste, or the like.

In an embodiment above, solder paste 13 on the upper surface of stencil 12 may be supplied by an automatic supply device or manually by an operator.

In an embodiment above, in S120 of the screen printing preparation processing routine, negative pressure is continuously supplied to stencil supporting surfaces 50a and 52a, but negative pressure may be supplied at only required times.

INDUSTRIAL APPLICABILITY

The present disclosure is applicable to the field of screen printing a viscous fluid loaded on the upper surface of a stencil onto a board using a squeegee.

REFERENCE SIGNS LIST

10: screen printer; 10a: machine frame; 12: stencil; 12a: stencil frame; 14: stencil frame holding rail; 16: raising and lowering table; 16a: table platform; 16b: leg section; 18: guide rail; 20: ball screw mechanism; 22: nut; 24: ball screw; 26: belt; 28: motor; 30: moving table; 32: steel ball; 34: board position adjusting device; 36: board holding member; 36a: conveyor belt; 36b: motor; 36c: inside surface; 38: board holding member; 38c: inside surface; 40: board holding member moving device; 42: support table; 44: support pin; 46: guide rod; 49: support table raising and lowering device; 50: stencil supporting member; 50a: stencil supporting surface; 50b: hole; 50c: hollow section; 50d: negative pressure device; 52: stencil supporting member; 52a: stencil supporting surface; 52b: hole; 52c: hollow section; 52d: negative pressure device; 54, 56: bridge member; 58: stencil supporting member moving device; 60: stencil cleaning unit; 62: cleaning sheet; 64: supply roller; 66: collection roller; 66a: motor; 70: squeegee unit; 71: first squeegee; 71a: first squeegee raising and lowering device; 72: second squeegee; 72a: second squeegee raising and lowering device; 74: squeegee head; 76: X-axis slider; 76a: X-axis motor; 78: Y-axis slider; 78a: Y-axis motor; 79: guide rail; 80: imaging unit; 81: upper camera; 82: lower camera; 83: X-axis slider; 83a: X-axis motor; 84: X-axis direction ball screw; 85: nut; 86: camera Y-axis guide rail 88: Y-axis slider; 88a: Y-axis motor; 90: control device; 90a: CPU; 90b: ROM; 90c: RAM; 90d: storage; 90e: bus; 90f input-output interface; 92: management device; 121: first stencil mark; 122: second stencil mark; 123: through-hole; M1: first board mark; M2: second board mark

The invention claimed is:

1. A screen printer for screen printing a viscous fluid loaded on an upper surface of a stencil using a squeegee, the screen printer comprising:
   a stencil edge section holding member configured to hold an edge section of the stencil;
   a board holding member configured to hold a board;
   a board holding member raising and lowering device configured to raise and lower the board holding member to and from a printing position set at a specified height for screen printing and a lower position that is lower than the printing position;
   a stencil supporting member provided independently from the board holding raising and lowering device and configured to support from below a portion of the stencil outside of a printing region of the stencil that is used when performing screen printing, the edge section of the stencil being held by the stencil edge section holding member;
   a squeegee raising and lowering device configured to raise and lower the squeegee to and from a contact position at which the squeegee contacts the upper surface of the stencil of which the edge section is held by a stencil edge holding member and a separation position that is higher than the contact position; and
   a control device configured to control the board holding member raising and lowering device and the squeegee raising and lowering device such that the squeegee arrives at the contact position before the board holding member holding the board is raised to the printing position in a screen printing preparation phase.

2. The screen printer of claim 1, wherein
the contact position is set directly on a support surface of the stencil supporting member.

3. The screen printer of claim 1, further including
an imaging device provided to move below the stencil in a direction parallel to the stencil and configured to image a stencil reference section and a board reference section used for alignment provided respectively on the printing region of the stencil and the board, and
a control means configured to control the board holding member raising and lowering device and the imaging device such that the imaging device images the stencil reference section and the board reference section in the screen printing preparation phase after making a gap between the lower surface of the stencil and the board held by the board holding member such that the imaging device can pass through the gap.

4. The screen printer of claim 1, further including
a negative pressure device configured to supply negative pressure to a negative pressure suction surface that supports a lower surface of the stencil among the stencil supporting member,
a stencil supporting member moving device configured to move the stencil supporting member in a direction parallel to the stencil, and a control device configured to control the negative pressure device and the stencil supporting member moving device such that, when the board holding member holding the board is at a cleaning position that is lower than the printing position, the stencil supporting member is moved in the direction parallel to the stencil while negative pressure is supplied to the negative pressure suction surface such that the lower surface of the stencil is sucked to the negative pressure suction surface.

5. The screen printer of claim 4, wherein
the stencil supporting member is provided as a pair to sandwich the printing region, and the stencil supporting member moving device moves at least one of the pair of the stencil supporting members in the direction parallel to the stencil.

6. A screen printing method for screen printing a viscous fluid loaded on an upper surface of a stencil using a squeegee, the screen printing method comprising:
(a) a step of holding a board using a board holding member;
(b) a step of raising the board holding member using a board holding member raising and lowering device to a printing position set at a specified height for screen printing,
during a screen printing preparation phase that is before the step (b), causing the squeegee to reach a contact position from a separation position that is higher than the contact position using a squeegee raising and lowering device to contact the upper surface of the stencil when a portion of the stencil outside of a printing region of the stencil that is used for screen printing is supported from below by a stencil supporting member provided separately to the board holding member raising and lowering device and an edge section of the stencil is held by a stencil edge holding member, and
controlling the board holding member raising and lowering device and the squeegee raising and lowering device such that the squeegee arrives at the contact position before the board holding member holding the board is raised to the printing position in a screen printing preparation phase.

7. A screen printing method for screen printing a viscous fluid loaded on an upper surface of a stencil using a squeegee, the screen printing method comprising:
(a) a step of holding a board using a board holding member;
(b) a step of raising the board holding member using a board holding member raising and lowering device to a printing position set at a specified height for screen printing;
(c) a step of raising and lowering the squeegee using a squeegee raising and lowering device to and from a contact position at which the squeegee contacts the upper surface of the stencil of which the edge section is held by a stencil edge holding member and a separation position that is higher than the contact position,
during a screen printing preparation phase that is after the step (a) and before the step (b), when a portion of the stencil outside of a printing region of the stencil that is used when performing screen printing is supported from below by a stencil supporting member provided separately from the board holding member raising and lowering device, using an imaging device to image a stencil reference section and a board reference section used for alignment provided respectively on the printing region of the stencil and the board after making a gap between a lower surface of the stencil and the board held by the board holding member such that the imaging device can pass through the gap, and
controlling the board holding member raising and lowering device and the squeegee raising and lowering device such that the squeegee arrives at the contact position before the board holding member holding the board is raised to the printing position in a screen printing preparation phase.

8. A screen printing method for screen printing a viscous fluid loaded on an upper surface of a stencil using a squeegee, the screen printing method comprising:
(a) a step of holding a board using a board holding member;
(b) a step of performing screen printing in a state with a portion of the stencil outside of a printing region of the stencil that is used when performing screen printing being supported from below the stencil using a negative pressure suction surface of a stencil supporting member that is provided separately from a board holding member raising and lowering device and the board holding member raised to a printing position set at a specified height for screen printing using the board holding member raising and lowering device;
(c) a step of performing cleaning by moving the stencil holding member in a direction parallel to the stencil after the board holding member has been lowered to a cleaning position that is lower than the printing position and while supplying negative pressure to the negative pressure suction surface such that the lower surface of the stencil is sucked to the negative pressure suction surface;
(d) a step of raising and lowering the squeegee using a squeegee raising and lowering device to and from a contact position at which the squeegee contacts the upper surface of the stencil of which the edge section is held by a stencil edge holding member and a separation position that is higher than the contact position; and
(e) a step of controlling the board holding member raising and lowering device and the squeegee raising and lowering device such that the squeegee arrives at the contact position before the board holding member holding the board is raised to the printing position in a screen printing preparation phase.

\* \* \* \* \*